(12) United States Patent
Brase

(10) Patent No.: US 6,812,130 B1
(45) Date of Patent: Nov. 2, 2004

(54) SELF-ALIGNED DUAL DAMASCENE ETCH USING A POLYMER

(75) Inventor: Gabriela Brase, Fishkill, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/501,124

(22) Filed: Feb. 9, 2000

(51) Int. Cl.⁷ .......................................... H01L 21/4763
(52) U.S. Cl. .................... 438/623; 438/624; 438/634; 438/637; 438/638; 438/666; 438/780; 438/782
(58) Field of Search ................... 438/623–624, 438/634, 637–638, 666, 780, 782

(56) References Cited

U.S. PATENT DOCUMENTS

| | | | |
|---|---|---|---|
| 5,422,309 A | 6/1995 | Zettler et al. ............... | 437/192 |
| 5,840,625 A | 11/1998 | Feldner ...................... | 438/626 |
| 5,854,126 A | 12/1998 | Tobben et al. .............. | 438/626 |
| 5,854,140 A | 12/1998 | Jaso et al. ................... | 438/740 |
| 5,960,318 A | 9/1999 | Peschke et al. ............. | 438/637 |
| 6,265,319 B1 * | 7/2001 | Jang ............................ | 438/723 |
| 6,271,127 B1 * | 8/2001 | Liu et al. .................... | 438/638 |
| 6,326,300 B1 * | 12/2001 | Liu et al. .................... | 438/638 |
| 6,660,630 B1 * | 12/2003 | Chang et al. ............... | 438/637 |
| 6,677,679 B1 * | 1/2004 | You et al. ................... | 257/758 |
| 2003/0224595 A1 * | 12/2003 | Smith et al. ................ | 438/637 |
| 2004/0110369 A1 * | 6/2004 | Jiang et al. ................. | 438/637 |

* cited by examiner

*Primary Examiner*—Lynne A. Gurley
(74) *Attorney, Agent, or Firm*—Lerner, David, Littenberg, Krumholz & Mentlik, LLP

(57) ABSTRACT

A method for forming a dual damascene structure for a semiconductor device, in accordance with the present invention, includes providing conductive regions on a first layer, forming an interlevel dielectric layer over the first layer and forming an etch stop layer over the interlevel dielectric layer. The etch stop layer includes a polymer material having a dielectric constant of less than about 3.0. The etch stop layer is patterned to form a via pattern, and a trench dielectric layer is deposited on the etch stop layer and in holes of the via pattern. Trenches are formed in the trench dielectric layer by etching the trench layer in accordance with a trench pattern, and vias are formed in the interlevel dielectric layer by etching through the trenches using the etch stop layer to self-align the trenches to the vias and expose the conductive regions on the first layer.

12 Claims, 2 Drawing Sheets

SELF-ALIGNED DUAL DAMASCENE ETCH USING A POLYMER

BACKGROUND

1. Technical Field

This disclosure relates to semiconductor fabrication and more particularly, to an etch stop layer and method for having low dielectric constant characteristics for improving circuit performance.

2. Description of the Related Art

Dual damascene structures are employed to form both contacts to lower metal structures and metal lines simultaneously in a single deposition process. Difficulties arise in forming vias and trenches in a dielectric layer which separates the metal structures from the metal lines to be formed. Via holes are placed at needed locations where connections are to be made through the dielectric layer, while trenches are formed over greater distances for the formation of metal lines. Since the vias and trenches have different geometry, the formation of vias and trenches are formed by different patterning steps.

To accommodate the different structures, that is, vias and trenches, an etch stop layer is sandwiched between two dielectric layers. The etch stop layer is formed from a silicon nitride material. Silicon nitride is employed to permit selective etching of a first dielectric layer, which may include an oxide material, to form metal lines. Then, the nitride is etched and used to pattern vias through a second dielectric layer, which is also typically an oxide material.

The silicon nitride etch stop layer includes a dielectric constant of about 4 or 5. For metal lines having higher density, for ground rules of 0.25 microns or less, silicon nitride suffers from a high dielectric constant which may result current leakage or cross-talk between adjacent metal line or between metal lines on different layers.

Therefore, a need exists for an improved etch stop layer which provides needed selectivity to adjacent layers, provides hard mask capabilities and has a decreased dielectric constant for improving the formation of dual damascene structures.

SUMMARY OF THE INVENTION

A method for forming a dual damascene structure for a semiconductor device, in accordance with the present invention, includes providing conductive regions on a first layer, forming an interlevel dielectric layer over the first layer and forming an etch stop layer over the interlevel dielectric layer. The etch stop layer includes a polymer material having a dielectric constant of less than about 3.0. The etch stop layer is patterned to form a via pattern, and a trench dielectric layer is deposited on the etch stop layer and in holes of the via pattern. Trenches are formed in the trench dielectric layer by etching the trench layer in accordance with a trench pattern, and vias are formed in the interlevel dielectric layer by etching through the trenches using the etch stop layer to self-align the trenches to the vias and expose the conductive regions on the first layer.

In other methods, the polymer preferably includes at least one of polyorylene-ether and polybenzoxazole dielectric. The step of providing conductive regions on a first layer may includes providing one of metal lines and diffusion regions. The step of forming a cap layer on the conductive regions to protect the conductive regions from oxidation may be included.

In still other methods, the interlevel dielectric layer and the trench dielectric layer may be comprised of a same material. The same material may include one of a nitride and an oxide. The interlevel dielectric layer and the trench dielectric layer are preferably selectively etchable relative to the etch stop layer. The interlevel dielectric layer and the trench dielectric layer may also be comprised of a different material. The step of patterning the etch stop layer to form a via pattern may include employing a hard mask layer to form the via pattern. The step of depositing conductive material to concurrently form contacts in the vias and conductive lines in the trenches may be included. The step of forming an etch stop layer over the interlevel dielectric layer may include spinning on and curing the polymer. The etch stop layer may include a thickness of between about 100 nm to about 250 nm.

Another method for forming a dual damascene structure for a semiconductor device includes the steps of providing conductive regions on a first layer, forming an interlevel dielectric layer over the first layer wherein the interlevel dielectric layer included a polymer material having a dielectric constant of less than about 3.0, and forming an etch stop layer over the interlevel dielectric layer. The method further includes patterning the etch stop layer to form a via pattern, depositing a trench dielectric layer on the etch stop layer and in holes of the via pattern wherein the trench dielectric layer includes a polymer material having a dielectric constant of less than about 3.0, and forming trenches in the trench dielectric layer by etching the trench layer in accordance with a trench pattern. Vias are formed in the interlevel dielectric layer by etching through the trenches using the etch stop layer to self-align the trenches to the vias and expose the conductive regions on the first layer.

In other methods, the polymer preferably includes at least one of polyorylene-ether and polybenzoxazole dielectric. The step of providing conductive regions on a first layer includes providing one of metal lines and diffusion regions may be included. The method may include the step of forming a cap layer on the conductive regions to protect the conductive regions from oxidation. The etch stop layer may include one of an oxide and a nitride. The interlevel dielectric layer and the trench dielectric layer are preferably selectively etchable relative to the etch stop layer. The interlevel dielectric layer and the trench dielectric layer may be comprised of a different polymer material.

In still other methods, the step of forming trenches in the trench dielectric layer by etching the trench layer in accordance with a trench pattern may include the step of patterning the trench dielectric layer using an oxide layer as a hard mask. The method may further include the step of depositing conductive material to concurrently form contacts in the vias and conductive lines in the trenches. The step of forming an interlevel dielectric layer may include spinning on and curing the polymer. The step of depositing a trench dielectric layer may also include spinning on and curing the polymer.

A dual damascene structure, in accordance with the invention, includes conductive regions on a first layer, an interlevel dielectric layer formed over the first layer and having vias therethrough, a trench dielectric layer having trenches formed therein in communication with the vias and an etch stop layer formed between the interlevel dielectric layer and the trench dielectric layer. The trenches and the vias are filled with a conductive material, and the conductive material forms conductive lines in the trenches, which are connected to the conductive regions of the first layer by contacts, formed in the vias. At least one of the interlevel dielectric layer, the trench dielectric layer and the etch stop layer includes a polymer material having a dielectric constant of less than or equal to 3.0.

In alternate embodiments, the polymer may include at least one of polyorylene-ether and polybenzoxazole dielectric. The interlevel dielectric layer and the trench dielectric layer may both include the polymer material, or the etch stop layer may include the polymer material. The etch stop layer preferably includes a thickness of between about 100 nm and about 250 nm. The adjacent conductive lines may have a space of less than or equal to 0.25 microns therebetween.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a new etch stop layer that surpasses prior art etch stop layers for dual damascene structures. The new etch stop layer provides, inter alia, selectivity to adjacent layers, improved dielectric characteristics and is capable of providing improved processing characteristics, such as for example, may be deposited with a greater thickness. The present invention provides for a polymer dielectric layer that prevents current leakage between adjacent conductive structures and reduces crosstalk between adjacent conductive structures.

Figure 1:
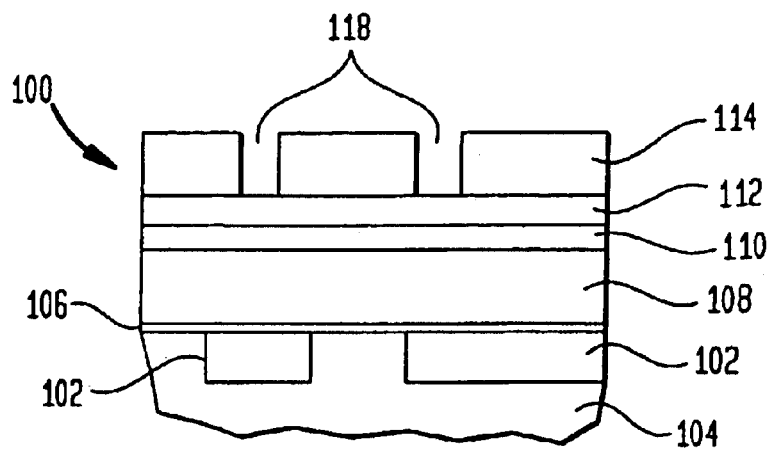
FIG. 1 is a cross-sectional view of a semiconductor device showing a resist layer for patterning a hard mask layer in accordance with the present invention.

Referring now in specific detail to the drawings in which like reference numerals identify similar or identical elements throughout the several views, and initially to FIG. 1, a partially fabricated semiconductor device 100 is shown. Semiconductor device 100 may include a memory chip, such as, a static random access (SRAM) memory chip, a dynamic random access memory (DRAM) chip, an embedded memory chip, etc. Semiconductor device 100 may also include a logic or processor chip, an application specific integrated circuit (ASIC) chip or the like. The present invention may be employed for any dual damascene structure or other multiple layer structure having conductive lines or electrodes separated by a dielectric layer. For illustrative purposes the present invention will be described in terms of a dual damascene structure which is self-aligned to underlying conductive or semiconductive regions 102.

Regions 102 may be formed over or in a substrate 104. Substrate 104 may include a plurality of dielectric layers, conductive layers, active devices, such as transistors, passive devices, such as capacitors or other components. Substrate 104 may include a semiconductor material, such as a mono-crystalline silicon which may include trenches and diffusions regions. Regions 102 may include conductive metal lines or diffusion regions. Regions 102 will now be illustratively described in terms of conductive lines.

A cap layer 106 may be deposited on regions 102 to prevent oxides from forming thereon in subsequent deposition processes. Cap layer 106 preferably includes a thin layer (a few nanometers) of silicon nitride. An interlevel dielectric layer 108 is formed on cap layer 106. Interlevel dielectric layer forms a via layer, or a layer used for the formation of vias to the underlying regions 106. Interlevel dielectric layer 108 may include an oxide, such as silicon dioxide or a glass, such as, boro-phosphor silicate glass (BPSG), boron silicate glass (BSG), phosphor silicate glass (PSG), Arsenic silicate glass (ASG), or equivalent materials. Advantageously, accordingly to the present invention a nitride layer may be employed for interlevel dielectric layer 108. The reasons for this will be explained in greater detail below.

An etch stop layer 110 is now formed on interlevel dielectric layer 108 in accordance with the present invention. Etch stop layer 110 is advantageously formed from a polymer material which provides selective etching relative to oxide or in some embodiments relative to nitrides. In a preferred embodiment, etch stop layer 110 is selectively etchable relative to both oxide and nitride materials. Etch stop layer may include polyorylene-ether, such as SILK, available from Dow Corning, Inc. or polybenzoxazole dielectric, such as CRA-X9111, available from Sumitomo Bakelite Co. Ltd., Japan. Other polymers may also be used.

Etch stop layer 110 is preferably spun onto interlevel dielectric layer 108 and cured. Etch stop layer 110 advantageously includes a dielectric constant of between about 2.0 to about 3.0. In one embodiment, a dielectric constant of about 2.6 is achieved although lower dielectric constant materials are preferred.

Etch stop layer 110 provides yet another advantage over the prior art. Prior art etch stop layers, typically include silicon nitride which must be kept as thin as possible to achieve needed aspect ratios of trenches or vias, i.e., keep the aspect ratios small. Therefore, the prior art silicon nitride etch stop layer was maintained at or below 100 nm. In accordance with the present invention, etch stop layer 110 may include a thickness of between about 70 nm to about 250 nm, preferably 200 nm to about 250 nm. Surprisingly, the thicker etch stop layer 110 still provides the needed aspect ratios for trenches and vias. Further advantages of the increased thickness will be clarified below.

A hard mask layer 112 is formed on etch stop layer 110. Hard mask layer 112 preferably includes the same material as interlevel dielectric layer 108, although different materials may be used. Hard mask layer 112 is selectively etchable relative to etch stop layer 110. Hard mask layer may include and oxide, such as a glass, or a nitride. A resist layer 114 is spun onto hard mask layer 112 and patterned using conventional methods, such as photolithography, to provide a via pattern 118. The via pattern will be employed to etch vias down to regions 102 to provide interlevel connections.

Figure 2:
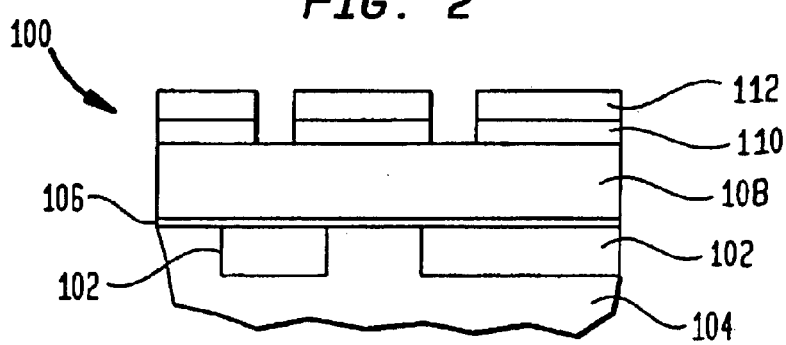
FIG. 2 is a cross-sectional view of the semiconductor device of FIG. 1 showing the hard mask layer being employed to pattern an etch stop layer in accordance with the present invention.

Referring to FIG. 2, via pattern 118 in resist layer 114 is employed to pattern hard mask layer 112. Resist layer 114 is then stripped from a top surface of hard mask layer 112. Hard mask layer 112 is, in turn, employed to etch etch stop layer 110. An anisotropic etching process, such as a reactive ion etch process, is preferably employed to etch through both hard mask layer 112 and etch stop layer 110 to transfer via pattern 118 thereto.

Figure 3:
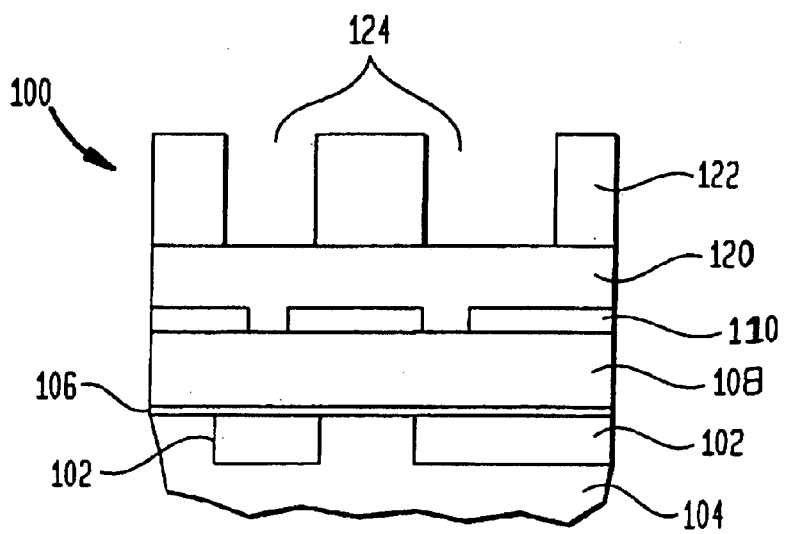
FIG. 3 is a cross-sectional view of the semiconductor device of FIG. 2 showing a trench dielectric layer being patterned to self-align trenches to vias and underlying conductive regions in accordance with the present invention.

Referring to FIG. 3, a dielectric layer 120 is deposited to fill in the via pattern transferred to hard mask layer 112 and etch stop layer 112. Dielectric layer 120 preferably includes the same material as hard mask layer 112, for example an oxide such as a silicate glass. Other materials may also be employed, for example a nitride layer may be deposited for layer 120. A resist layer 122 is formed on dielectric layer 120 and patterned using conventional methods. Resist layer 122 is patterned in accordance with a trench pattern 124, which includes the locations of trenches which will be employed for the formation of conductive lines for the dual damascene structure.

Figure 4:
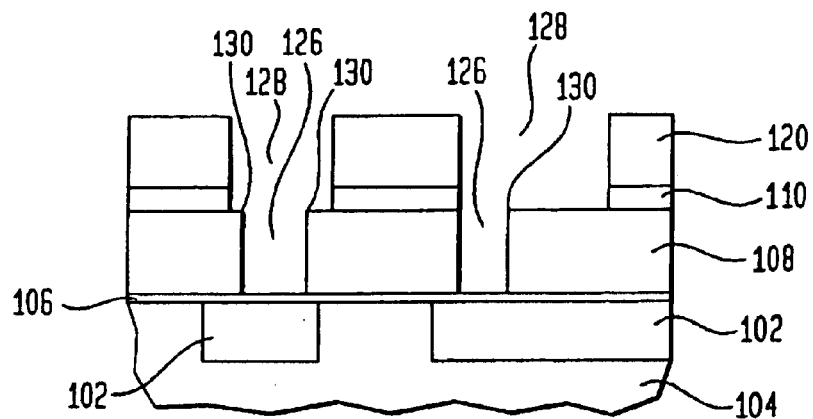
FIG. 4 is a cross-sectional view of the semiconductor device of FIG. 3 showing trenches and vias opened to form a dual damascene structure in accordance with the present invention.

Referring to FIG. 4, dielectric layer 120 and interlevel dielectric layer 108 are now etched in accordance with trench pattern 124 and via pattern 118. Via pattern 118 has been formed in etch stop layer 110 while trench pattern 124 is formed by resist layer 122 (See FIGS. 1–3). An anisotropic etch process, such as, a reactive ion etch process, is performed to form both vias 126 and trenches 128 in interlevel dielectric layer 108 and dielectric layer 120, respectively. Where vias 126 are not needed, etch stop layer 110 has not been patterned to form holes therein. Since etch stop layer 110 includes a polymer material the etching process is selective and does not etch etch stop layer 110 as quickly as layers 108 and 120. In this way, both trenches 128 and vias 126 are formed by a same etch process. Advantageously, trenches 128 are self-aligned to vias 126 and regions 102.

Etch stop layer 110 provides selectivity to oxides or nitrides in reactive ion etch (RIE) processes to make a self-aligned dual damascene etch using a polymer etch stop layer feasible. Further, etch stop layer may be made thicker to provide a higher overetch margin.

As a result of etching, etch stop layer 110 is eroded. However, well-defined corners 130 remain and etch stop layer 110 now comprises sidewalls of trench 128. The low dielectric constant value of etch stop layer 110 now contributes to an improved dielectric strength between adjacent trenches 128, thereby reducing cross-talk and reducing current leakage. Surprisingly, by the present invention, current leakage is reduced significantly and cross talk is reduced from between about 10% and about 15%. This is particularly useful in devices which have smaller ground rules, for example, less than or equal to about 0.25 micron ground rule (e.g., minimum feature size). By providing an etch stop layer 110 having a greater thickness. Corners 130 are more likely to be well defined and corner rounding is more likely to be eliminated. Further, longer via depths are achievable (higher aspect ratios) with a thicker etch stop layer.

Figure 5:
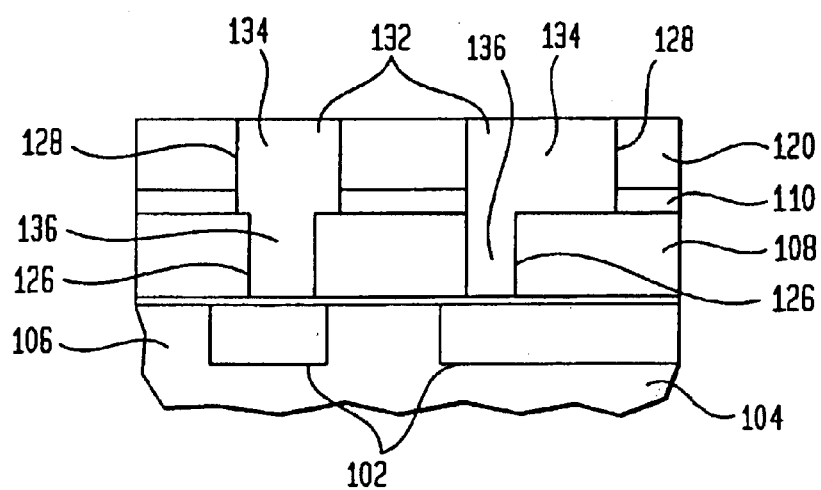
FIG. 5 is a cross-sectional view of the semiconductor device of FIG. 4 showing trenches and vias filled with conductive material to form the dual damascene structure in accordance with the present invention.

Referring to FIG. 5, cap layer 106 is opened to gain access to regions 102. A conductive material 132 is deposited in trenches 128 and vias 126 to form conductive lines 134 and contacts 136 in a same deposition process. Conductive material may include aluminum, copper, polysilicon or other conductive materials.

Figure 6:
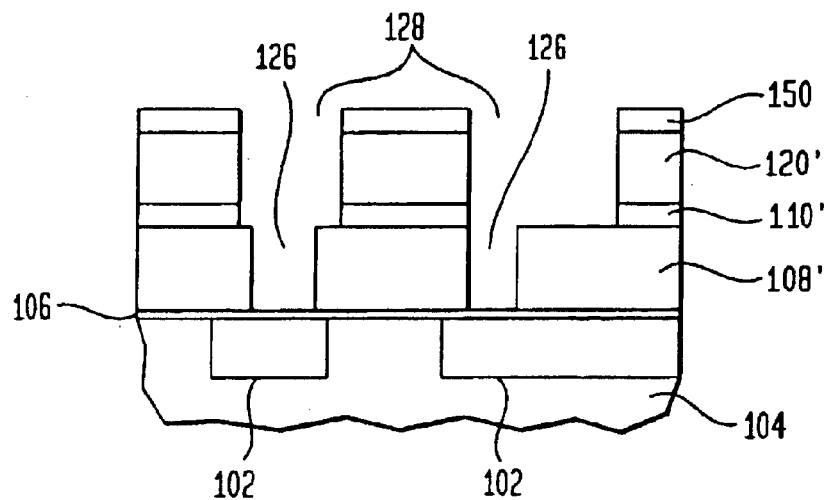
FIG. 6 is a cross-sectional view of another embodiment of a semiconductor device having polymer interlevel and trench dielectric layers in accordance with the present invention.

Referring to FIG. 6, an alternate embodiment of the present invention includes forming interlevel dielectric layer 108 as a polymer material. In this embodiment, regions 102 are formed and cap layer 106 deposited thereon. An interlevel dielectric layer 108' is deposited and formed from a polymer material, for example, polyorylene-ether, or polybenzoxazole dielectric. Other polymers may also be used.

An etch stop layer 110' is selectively etchable relative to the polymer material of dielectric layer 108' and a dielectric layer 120' which is formed after etch stop layer 110' is patterned using a resist patterning process prior to the formation of dielectric layer 120'. The structuring of etch stop layer 110' does not need a hard mask; instead a photoresist process is employed. However, a hard mask layer 150 is patterned using a resist patterning process and then used to pattern layer 108'. Etch stop layer 110' may include oxide or nitride materials. Dielectric layers 108' and 120' are preferably spun onto cap layer 106 and etch stop layer 110' and cured. Dielectric layers 108' and 120' advantageously include a dielectric constant of between about 2.0 to about 3.0. In one embodiment, a dielectric constant of about 2.6 is achieved although lower dielectric constant materials are preferred and may be achieved in accordance with the invention. Hard mask layer 150 is stripped from the top surface. It is to be understood that layers 108' and 120' may both be formed from a same or different polymer, and that in some embodiments only one of layers 108' and 120' may include a polymer material in accordance with the present invention.

The structure shown in FIG. 6 provides greater dielectric strength between adjacent structures and results in the same structure of FIG. 5, except interlevel dielectric layer 108 and dielectric layer 120 are formed from a polymer material. Etch stop layer 110 is formed from a material which is selectively etchable relative to the polymer material. The structure of FIG. 6 provides a larger portion of trench sidewalls (and via sidewalls) which have a low dielectric constant. This provides an even greater improvement in reducing cross-talk (e.g., greater than a 15% reduction) and current leakage between adjacent conductive structures which are to be formed in trenches 128 and vias 126.

Having described preferred embodiments for self-aligned dual damascene etch using a polymer (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a dual damascene structure for a semiconductor device comprising the steps of:
   providing conductive regions on a first layer;
   forming an interlevel dielectric layer over the first layer;
   forming an etch stop layer over the interlevel dielectric layer, the etch stop layer including a polymer material having a dielectric constant of less than about 3.0;
   patterning the etch stop layer to form a via pattern;
   depositing a trench dielectric layer on the etch stop layer and in holes of the via pattern;
   forming trenches in the trench dielectric layer by etching the trench layer in accordance with a trench pattern; and forming vias in the interlevel dielectric layer by etching through the trenches using the etch stop layer to self-align the trenches to the vias and expose the conductive regions on the first layer, said etching eroding portions of the etch stop layer such that the etch stop layer forms part of the sidewalls of the trenches, thereby improving dielectric strength of the interlevel dielectric layer.

2. The method as recited in claim 1, wherein the polymer includes at least one of polyorylene-ether and polybenzoxazole dielectric.

3. The method as recited in claim 1, wherein the step of providing conductive regions on a first layer includes providing one of metal lines and diffusion regions.

4. The method as recited in claim 1, further comprising the step of forming a cap layer on the conductive regions to protect the conductive regions from oxidation.

5. The method as recited in claim 1, wherein the interlevel dielectric layer and the trench dielectric layer are comprised of a same material.

6. The method as recited in claim 5, wherein the same material includes one of a nitride and an oxide.

7. The method as recited in claim 1, wherein the interlevel dielectric layer and the trench dielectric layer are selectively etchable relative to the etch stop layer.

8. The method as recited in claim 1, wherein the interlevel dielectric layer and the trench dielectric layer are comprised of a different material.

9. The method as recited in claim 1, wherein the step of patterning the etch stop layer to form a via pattern includes employing a hard mask layer to form the via pattern.

10. The method as recited in claim 1, further comprising the step of depositing conductive material to concurrently form contacts in the vias and conductive lines in the trenches.

11. The method as recited in claim 1, wherein the step of forming an etch stop layer over the interlevel dielectric layer includes spinning on and curing the polymer.

12. The method as recited in claim 1, wherein the etch stop layer has a thickness greater than 200 nm and at most about 250 nm.

* * * * *